(12) United States Patent
Menon

(10) Patent No.: US 7,989,151 B2
(45) Date of Patent: Aug. 2, 2011

(54) RESOLUTION ENHANCEMENT IN OPTICAL LITHOGRAPHY VIA ABSORBANCE-MODULATION ENABLED MULTIPLE EXPOSURES

(75) Inventor: Rajesh Menon, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 193 days.

(21) Appl. No.: 11/565,051

(22) Filed: Nov. 30, 2006

(65) Prior Publication Data

US 2007/0154850 A1 Jul. 5, 2007

Related U.S. Application Data

(63) Continuation-in-part of application No. 11/154,352, filed on Jun. 6, 2005, now Pat. No. 7,667,819, and a continuation-in-part of application No. 11/331,752, filed on Jan. 13, 2005, now Pat. No. 7,714,988.

(51) Int. Cl.
  *G03B 27/54* (2006.01)
(52) U.S. Cl. ......... 430/322; 430/396; 430/394; 430/952
(58) Field of Classification Search .................. None
  See application file for complete search history.

(56) References Cited

U.S. PATENT DOCUMENTS

| 6,277,545 | B1 | 8/2001 | Tetsuya et al. | |
| 6,492,068 | B1 * | 12/2002 | Suzuki | 430/5 |
| 6,879,376 | B2 | 4/2005 | Case et al. | |
| 2003/0203284 | A1 * | 10/2003 | Iriguchi et al. | 430/1 |
| 2004/0152011 | A1 | 8/2004 | Chen et al. | |
| 2005/0064347 | A1 * | 3/2005 | Wang | 430/322 |

FOREIGN PATENT DOCUMENTS

| WO | 2004053938 | 6/2004 |
| WO | 2005031460 | 4/2005 |
| WO | 2006088643 | 8/2006 |

* cited by examiner

*Primary Examiner* — Daborah Chacko-Davis
(74) *Attorney, Agent, or Firm* — Gauthier & Conners LLP

(57) ABSTRACT

A method to enhance resolution in optical lithography via absorbance-modulation involves exposing an opaque absorbance modulation layer (AML) to a first waveform having wavelength, $8_1$, with the first exposure forming a first set of transparent regions in the opaque AML and forming a first pattern made of a set of exposed regions in a photoresist layer. Next, the AML is restored to its original opaque state. Next, the restored AML is re-exposed to the first waveform having wavelength, $8_1$, with the exposure forming a second set of transparent regions in the opaque AML and forming a second pattern having a set of exposed regions in a photoresist layer. The first and second patterns in the photoresist layer form a final pattern with enhanced resolution and decreased spatial period than the first pattern. In another scenario, instead of exposing the AML to a first waveform, two waveforms are used (the second being complimentary to the first) to ensure that the transmitted image has sharper edges compared to the original image.

16 Claims, 4 Drawing Sheets

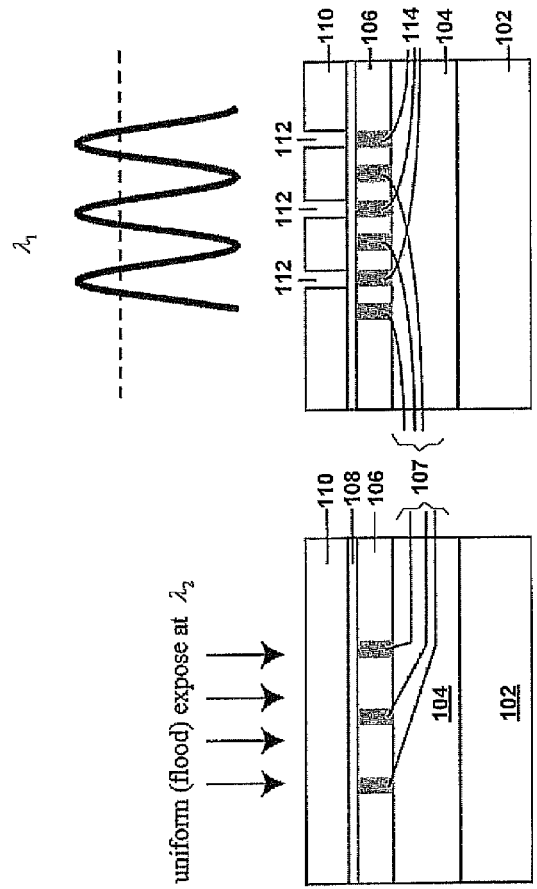
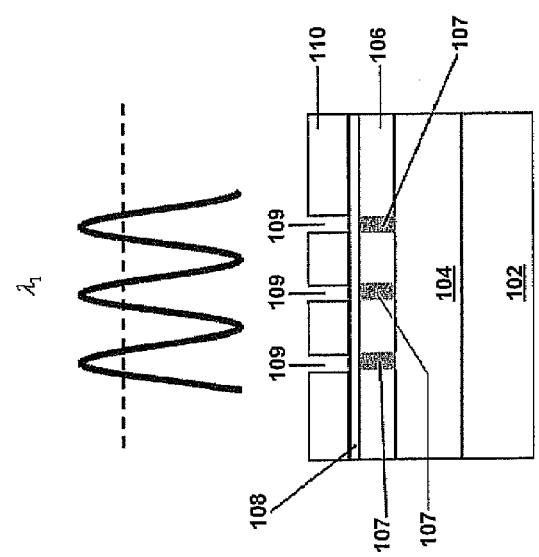
FIGURE 2c
FIGURE 2b
FIGURE 2a

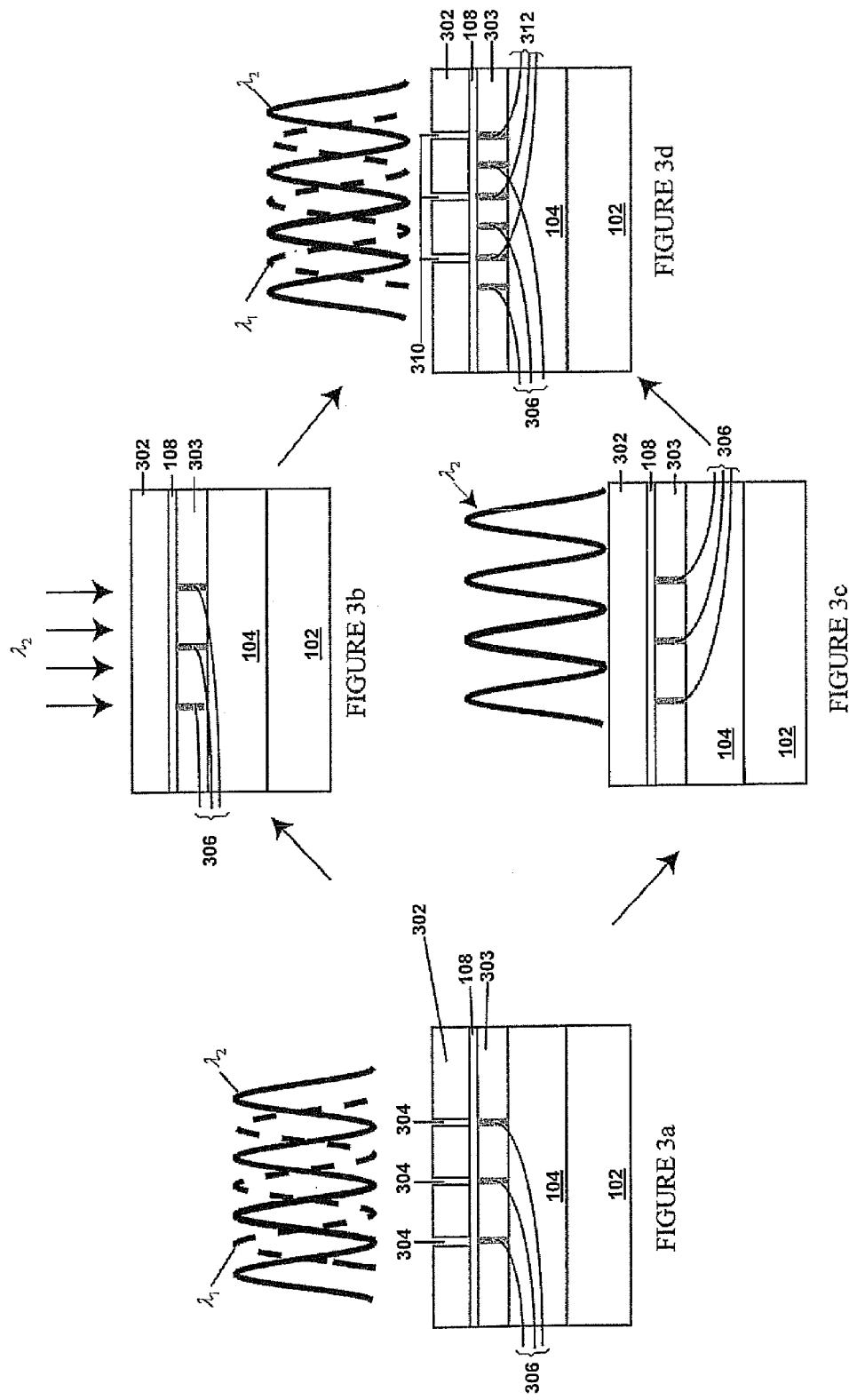

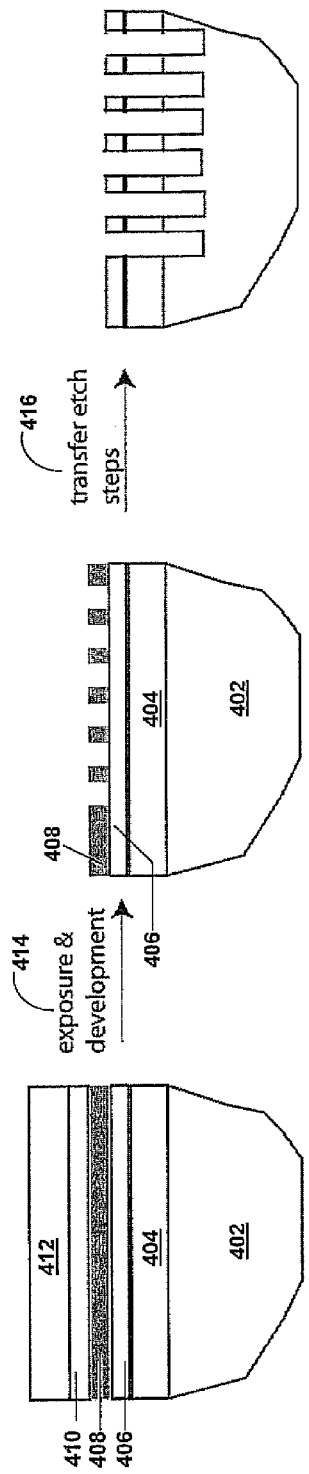

RESOLUTION ENHANCEMENT IN OPTICAL LITHOGRAPHY VIA ABSORBANCE-MODULATION ENABLED MULTIPLE EXPOSURES

RELATED APPLICATIONS

This application is a continuation-in-part of application Ser. No. 11/154,352 titled "System and Method for Contrast Enhanced Zone Plate Array Lithography", filed Jun. 6, 2005, and application Ser. No. 11/331,752 titled "System and Method for Absorbance Modulation Lithography", filed Jan. 13, 2005.

BACKGROUND OF THE INVENTION

1. Field of Invention

The present invention relates generally to the field of optical lithography. More specifically, the present invention is related to resolution enhancement in optical lithography via absorbance modulation.

2. Discussion of Prior Art

The following references provide general background in the area of optical lithography, but none of them, either by themselves or in combination, teaches or suggests the features of the present invention.

The U.S. patent to Case et al. U.S. Pat. No. 6,879,376 teaches a method and apparatus for exposing photoresists using programmable masks. Case's method increases imaging resolution to provide fully dense integrated circuit patterns made of very small features on photoresist-coated silicon wafers by optical lithography.

The patent publication to Chen et al. (2004/0152011) provides for a reversible photobleachable materials based on nano-sized semiconductor particles and their optical applications, wherein the applications include reversible contrast enhancement layer (R-CEL) in optical lithography, lithography mask inspection and writing and optical storage technologies.

Whatever the precise merits, features, and advantages of the above cited references, none of them achieves or fulfills the purposes of the present invention.

SUMMARY OF THE INVENTION

The present invention provides for a method to enhance resolution in optical lithography via absorbance-modulation comprising the steps of: (a) exposing an opaque absorbance modulation layer (AML) to a first waveform having wavelength, $8_1$, the exposure forming a first plurality of transparent regions in the opaque AML and a first pattern comprising a plurality of exposed regions in the photoresist layer; (b) restoring the AML to its original opaque state; (c) exposing the restored AML to the first waveform having wavelength, $8_1$, with the exposure forming a second plurality of transparent regions in the opaque AML and a second pattern comprising a plurality of exposed regions in a photoresist layer, wherein the first and second pattern in the photoresist layer form a final pattern with enhanced resolution and decreased spatial period than the first pattern. It should be noted that more than 2 sequential exposures can be performed in the above-described process. Therefore, the number of sequential exposures should not be used to limit the scope of the present invention.

The present invention also provides for a method to enhance resolution in optical lithography via absorbance-modulation comprising the steps of: (a) simultaneously exposing an opaque absorbance modulation layer (AML) to a first waveform having wavelength, $8_1$, and a second waveform having wavelength, $8_2$, wherein the second waveform is a complimentary image of the first waveform and the exposure forms a first plurality of transparent regions in the opaque AML and a first pattern comprising a plurality of exposed regions in a photoresist layer; (b) restoring said AML to original opaque state; (c) simultaneously exposing the restored AML to the first waveform having wavelength, $8_1$, and the second waveform having wavelength, $8_2$, with the exposure forming a second plurality of transparent regions in the opaque AML and a second pattern comprising plurality of exposed regions in a photoresist layer, and the first and second pattern in the photoresist layer forming a final pattern with enhanced resolution and decreased spatial period than said first pattern. It should be noted that more than 2 sequential exposures can be performed in the above-described process. Therefore, the number of sequential exposures should not be used to limit the scope of the present invention.

The present invention also provides for a method to enhance resolution in optical lithography via absorbance-modulation comprising the steps of: (a) projecting an image having wavelength, $8_1$, onto an opaque absorbance modulation layer (AML) formed on top of a photoresist/anti-reflective coating (ARC)/substrate stack, with the exposure forming a first plurality of transparent regions in the opaque AML and a first pattern comprising a plurality of exposed regions in the photoresist layer; (b) restoring the AML to original opaque state; (c) projecting the image having wavelength, $8_1$, onto the restored AML, with the exposure forming a second plurality of transparent regions in the opaque AML and a second pattern comprising a plurality of exposed regions in the photoresist layer, and the first and second pattern in said photoresist layer forming a final pattern with enhanced resolution and decreased spatial period than the first pattern. It should be noted that more than 2 sequential exposures can be performed in the above-described process. Therefore, the number of sequential exposures should not be used to limit the scope of the present invention.

The present invention provides for a method to enhance resolution in optical lithography via absorbance-modulation comprising the steps of: (a) simultaneously exposing an opaque absorbance modulation layer (AML) formed on top of a photoresist/anti-reflective coating (ARC)/substrate stack to a first image having wavelength, $8_1$, and a second image having wavelength, $8_2$, with $8_2$ being a complimentary image of said $8_1$, and the exposure forming a first plurality of transparent regions in the opaque AML and a first pattern comprising a plurality of exposed regions in the photoresist layer; (b) restoring the AML to its original opaque state; (c) simultaneously exposing the restored AML to the first image having wavelength, $8_1$, and the second image having wavelength, $8_2$, with the exposure forming a second plurality of transparent regions in the opaque AML and a second pattern comprising a plurality of exposed regions in the photoresist layer, and the first and second pattern in the photoresist layer forming a final pattern with enhanced resolution and decreased spatial period than the first pattern. It should be noted that more than 2 sequential exposures can be performed in the above-described process. Therefore, the number of sequential exposures should not be used to limit the scope of the present invention.

BRIEF DESCRIPTION OF THE DRAWINGS

FIG. 2 illustrates a first embodiment of the present invention.

FIG. 3 illustrates a second embodiment of the present invention.

FIG. 4 illustrates the use of a thin imaging layer (photoresist) along with additional (transfer) layers to improve the robustness of the present invention's methods.

DESCRIPTION OF THE PREFERRED EMBODIMENTS

Figure 1:
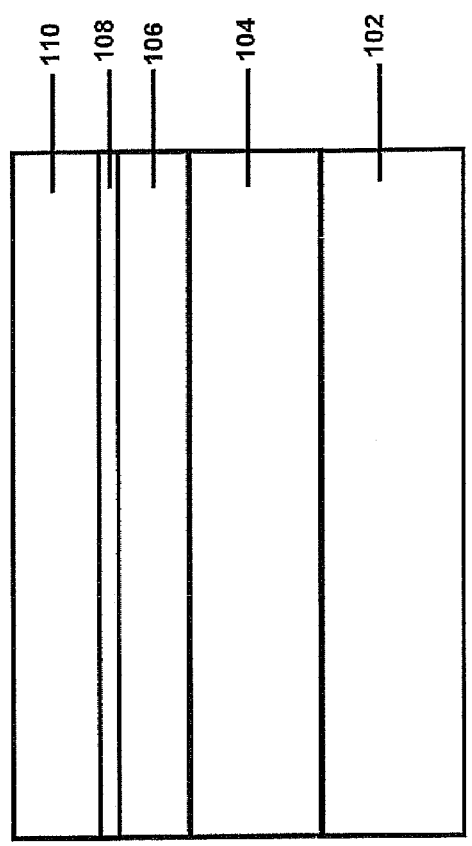
FIG. 1 illustrates a photoresist/ARC/substrate stack along with an absorbance modulation layer (AML).

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

The present invention provides resolution enhancement in optical lithography via absorbance-modulation enabled multiple exposures.

The present invention utilizes absorbance modulation to enable multiple exposures and subsequent resolution enhancement in optical lithography. Two specific embodiments are described, however, the concept can be generalized to any form of optical lithography including (but not limited to) optical projection lithography, contact photolithography, proximity photolithography, scanning image lithography, etc.

FIG. 1 illustrates a typical stacked structure used in absorbance modulation. FIG. 1's structure comprises substrate 102, antireflective coating (ARC) 104, photoresist layer 106, barrier layer 108, and an opaque absorbance modulation layer (AML) 110.

FIGS. 2a-c illustrate one embodiment of the present invention's method to enhance resolution in optical lithography via absorbance-modulation via multiple exposures. In FIG. 2a, the absorbance of AML 110 is reversibly decreased by exposure to $8_1$. In FIG. 2a, the original absorbance of AML 110 is regained by exposure to $8_2$.

In the embodiment, an image is projected, in a first exposure process as shown in FIG. 2a, by an optical system onto an opaque AML 110. Even though the example depicts the image used as a sinusoid, it should be noted that any geometry can be decomposed using Fourier techniques into a sum of sinusoids and, hence, the resolution of any geometry may be increased by the present invention. This exposure process results in the formation of transparent areas 109 on opaque AML 110 and exposed regions 107 in photoresist layer 106. This exposure process is adjusted such that the desired pattern having a small duty cycle (e.g., <50%) is recorded as shown in the FIG. 2a.

Subsequently, as shown in FIG. 2b, a recovery process is initiated wherein a flood exposure at $8_2$ converts the AML 110 to its original opaque state. It should be noted that the recovery process may also be performed by thermal means. Thermal means refers to the fact that the transparent form of AML may be unstable, and spontaneously revert back to the opaque form. This transparent-to-opaque reaction proceeds due to absorbed heat from the ambient. This is true for azobenzenes, for example. However, the preferred means of initiating the reverse reaction is photochemical, i.e., by exposure to wavelength, $8_2$ (it should be noted that exposure to a third wavelength, $8_2$, is also envisioned).

After such recovery, a second exposure is performed as shown in FIG. 2c. This second exposure decreases the spatial period of the final pattern. As a result of the second exposure process, transparent areas 112 are formed on opaque AML 110 and exposed regions 114 (in addition to the previously formed exposed regions 107) are formed in photoresist layer 106.

It should be noted that the above process can be iteratively performed for multiple exposures, and the specific number of exposures should not be used to limit the scope of the invention.

Although the illustrations depict a one-dimensional image (i.e., sinusoid), the invention is equally applicable to images in two- and three-dimensions.

According to the first embodiment, the present invention provides for a method to enhance resolution in optical lithography via absorbance-modulation comprising the steps of: (a) exposing an opaque absorbance modulation layer (AML) 110 to a first waveform having wavelength, $8_1$, the exposure forming a first plurality of transparent regions 109 in the opaque AML 110 and a first pattern comprising a plurality of exposed regions 107 in the photoresist layer (see FIG. 2a); (b) restoring the AML 110 to its original opaque state (see FIG. 2b); (c) exposing the restored AML to the first waveform having wavelength, $8_1$, with the exposure forming a second plurality of transparent regions 112 in the opaque AML and a second pattern comprising a plurality of exposed regions 114 in a photoresist layer (see FIG. 2c), wherein the first and second pattern in the photoresist layer form a final pattern with enhanced resolution and decreased spatial period than the first pattern.

Although, the various embodiments detail 2 exposures, it should be noted that more than 2 exposures can be performed, and such exposures are within the scope of the present invention.

Also, according to the first embodiment, the present invention also provides for a method to enhance resolution in optical lithography via absorbance-modulation comprising the steps of: (a) projecting an image having wavelength, $8_1$, onto an opaque absorbance modulation layer (AML) 110 formed on top of a photoresist 106/anti-reflective coating (ARC) 104/substrate 102 stack, with the exposure forming a first plurality of transparent regions 109 in the opaque AML 110 and a first pattern comprising a plurality of exposed regions 107 in the photoresist layer 106 (see FIG. 2a); (b) restoring the AML 110 to original opaque state (see FIG. 2b); (c) projecting the image having wavelength, $8_1$, onto the restored AML 110, with the exposure forming a second plurality of transparent regions 112 in the opaque AML and a second pattern comprising a plurality of exposed regions 114 in the photoresist layer, and the first and second pattern in said photoresist layer forming a final pattern with enhanced resolution and decreased spatial period than the first pattern.

FIGS. 3a-d illustrate a second embodiment of the present invention. In this embodiment, as shown in FIG. 3a, the AML 302 is illuminated by the image at $8_1$ and its complimentary image at $8_2$. Absorbance modulation at two wavelengths (i.e., $8_1$ and $8_2$) ensures that the transmitted image has much sharper edges compared to the original image. In particular, the sharpness and the feature sizes in the image can be controlled by the ratio of the intensities at the two wavelengths, as well as the photophysical characteristics of the AML.

FIGS. 3b and 3c illustrates two ways in which the AML reverts back to its original state (i.e., to fully opaque) once the first exposure is completed. According to FIG. 3b, the AML reverts to its original state by a flood exposure at $8_2$. According to FIG. 3c, the AML reverts to its original state by exposure of the complimentary image at $8_2$ after relative translation of the substrate or by thermal means.

It should be noted that subsequent exposures can then be conducted in a similar manner, as shown in FIG. 3d, followed by their respective recovery steps to achieved patterning of dense features.

It should also be noted that although the patterns shown in the FIGS. 1 and 2 are sinusoids, the present invention is not limited to sinusoids. The resolution of any pattern can be increased based on the teaching of the present invention.

In the $2^{nd}$ embodiment, it is important to generate the image at $8_1$ and its complimentary image at $8_2$. This can be achieved by a variety of means including a holographic photomask designed to operate at the two wavelengths. A diffractive or holographic mask may be illuminated by both wavelengths $8_1$ and $8_2$, simultaneously. When the mask is properly designed, this can result in projecting an image at $8_1$ and the complimentary image at $8_2$, coincident with one another. When these images are incident on the AML, a sharpened image is transmitted down into the recording layer (photoresist). Moving the substrate combined with multiple exposures will result in patterns of complex geometries at high resolution and high image quality.

In both embodiments, a thin imaging layer (photoresist) along with additional (transfer) layers may also be used to improve the process robustness (see FIGS. 4a-c). The recovery of the AML may also be initiated by exposures to a third wavelength. The structure of FIG. 4a comprises: silicon layer 402, ARC layer 404, transfer layer 406, a thin photoresist layer 408, barrier layer 410, and AML layer 412. A thin photoresist layer is used to image the pattern. After exposure and development 414, a series of transfer etch steps 416 are carried out to transfer the pattern from the photoresist layer 408 into the transfer layer 406, the ARC 404, and finally into the substrate 402 (see FIG. 4c). Such a multi-layer stack thus allows the image to be recorded by a thin photoresist layer, and the patterns can still be reliably transferred into the underlying substrate (see FIG. 4c).

According to the second embodiment, the present invention provides for a method to enhance resolution in optical lithography via absorbance-modulation comprising the steps of: (a) simultaneously exposing an opaque absorbance modulation layer (AML) 302 to a first waveform having wavelength, $8_1$, and a second waveform having wavelength, $8_2$, wherein the second waveform is a complimentary image of the first waveform and the exposure forms a first plurality of transparent regions 304 in the opaque AML 302 and a first pattern comprising a plurality of exposed regions 306 in a photoresist layer 303 (see FIG. 3a); (b) restoring said AML to original opaque state (see FIGS. 3b and 3c); (c) simultaneously exposing the restored AML 308 to the first waveform having wavelength, $8_1$, and the second waveform having wavelength, $8_2$, with the exposure forming a second plurality of transparent regions 310 in the opaque AML 308 and a second pattern comprising plurality of exposed regions 312 in a photoresist layer, and the first and second patterns in the photoresist layer forming a final pattern with enhanced resolution and decreased spatial period than said first pattern.

Also, according to the second embodiment, the present invention provides for a method to enhance resolution in optical lithography via absorbance-modulation comprising the steps of: (a) simultaneously exposing an opaque absorbance modulation layer (AML) 302 formed on top of a photoresist 303/anti-reflective coating (ARC) 104/substrate 102 stack to a first image having wavelength, $8_1$, and a second image having wavelength, $8_2$, with $8_2$ being a complimentary image of said $8_1$, and the exposure forming a first plurality of transparent regions 304 in the opaque AML 302 and a first pattern comprising a plurality of exposed regions 306 in the photoresist layer (see FIG. 3a); (b) restoring the AML 302 to its original opaque state (see FIGS. 3b-c); (c) simultaneously exposing the restored AML 302 to the first image having wavelength, $8_1$, and the second image having wavelength, $8_2$, with the exposure forming a second plurality of transparent regions 310 in the opaque AML 302 and a second pattern comprising a plurality of exposed regions 312 in the photoresist layer 303, and the first and second pattern in the photoresist layer forming a final pattern with enhanced resolution and decreased spatial period than the first pattern.

CONCLUSION

A system and method has been shown in the above embodiments for the effective implementation of resolution enhancement in optical lithography via absorbance-modulation enabled multiple exposures. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by the type of waveform used to form the pattern or type of means used to recover AML.

The invention claimed is:

1. A method to enhance resolution in optical lithography via absorbance-modulation comprising:
   a. simultaneously exposing an opaque absorbance modulation layer (AML) to a first waveform having wavelength, $8_1$, and a second waveform having wavelength, $8_2$, the wavelength $8_1$ and the wavelength $8_2$ are mutually different, said second waveform being a complimentary image of said first waveform, a first exposure forming a first plurality of transparent regions in said opaque AML and a first pattern comprising a plurality of exposed regions in a photoresist layer;
   b. restoring said AML to original opaque state;
   c. simultaneously exposing said restored AML to said first waveform having wavelength, $8_1$, and said second waveform having wavelength, $8_2$, a second exposure forming a second plurality of transparent regions in said opaque AML and a second pattern comprising plurality of exposed regions in the photoresist layer,
   said first and second pattern in said photoresist layer forming a final pattern with enhanced resolution and decreased spatial period than said first pattern;
   d. iteratively performing steps a-c over multiple exposures using said first and second waveforms; and
   e. transferring said final pattern from the photoresist layer into a transfer layer, an anti-reflective coating layer, and a substrate by using etching.

2. The method of claim 1, wherein said restoring step b is done via a uniform exposure to said second waveform with the wavelength, $8_2$.

3. The method of claim 1, wherein said restoring step b is done via a uniform exposure to a third waveform with wavelength, $8_3$.

4. The method of claim 1, wherein said restoring step b is done via thermal means.

5. The method of claim 1, wherein said first and second waveforms are sinusoidal.

6. The method of claim 1, wherein said first and second waveforms are implemented via a holographic photomask designated to operate at the wavelengths $8_1$ and $8_2$, respectively.

7. The method of claim 1, wherein sharpness and feature sizes of said first and second patterns are controlled by a ratio of the intensities at the two wavelengths, $\lambda_1$ and $\lambda_2$, in addition to photophysical characteristics of the AML.

8. A method to enhance resolution in optical lithography via absorbance-modulation comprising:
   a. projecting a first image having wavelength, $\lambda_1$ and a second image having wavelength, $\lambda_2$ simultaneously, onto an opaque absorbance modulation layer (AML) formed on top of a photoresist layer/anti-reflective coating (ARC)/substrate stack, the wavelength $\lambda_1$ and the wavelength $\lambda_2$ are mutually different, a first exposure forming a first plurality of transparent regions in said opaque AML and a first pattern comprising a plurality of exposed regions in said photoresist layer;
   b. restoring said AML to original opaque state;
   c. projecting said image having wavelength, $\lambda_1$ and said second image having wavelength, $\lambda_2$, simultaneously onto said restored AML, a second exposure forming a second plurality of transparent regions in said opaque AML and a second pattern comprising plurality of exposed regions in the photoresist layer,
   said first and second pattern in said photoresist layer forming a final pattern with enhanced resolution and decreased spatial period than said first pattern;
   d. iteratively performing steps a-c over multiple exposures; and
   e. transferring said final pattern from the photoresist layer into said photoresist layer/anti-reflective coating (ARC)/substrate stack by using etching.

9. The method of claim 8, wherein said restoring step b is done via a uniform exposure to said second image with the wavelength, $\lambda_2$.

10. The method of claim 8, wherein said restoring step b is done via thermal means.

11. The method of claim 8, wherein said AML, in step a, is simultaneously exposed to said second image having the wavelength, $\lambda_2$, that is complimentary to said first image having the wavelength, $\lambda_1$.

12. A method to enhance resolution in optical lithography via absorbance-modulation comprising:
   a. simultaneously exposing an opaque absorbance modulation layer (AML) formed on top of a photoresist layer/anti-reflective coating (ARC)/substrate stack to a first image having wavelength, $\lambda_1$, and a second image having wavelength, $\lambda_2$, said $\lambda_2$ being a complimentary image of said $\lambda_1$, the wavelength $\lambda_1$ and the wavelength $\lambda_2$ are mutually different, said exposure forming a first plurality of transparent regions in said opaque AML and a first pattern comprising a plurality of exposed regions in said photoresist layer;
   b. restoring said AML to original opaque state;
   c. simultaneously exposing said restored AML to said first image having the wavelength, $\lambda_1$, and said second image having the wavelength, $\lambda_2$, said exposure forming a second plurality of transparent regions in said opaque AML and a second pattern comprising plurality of exposed regions in said photoresist layer,
   said first and second pattern in said photoresist layer forming a final pattern with enhanced resolution and decreased spatial period than said first pattern;
   d. iteratively performing steps a-c over multiple exposures using said first and second images; and
   e. transferring said final pattern from the photoresist layer into said photoresist layer/anti-reflective coating (ARC)/substrate stack by using etching.

13. The method of claim 12, wherein said restoring step b is done via a uniform exposure to said second image with the wavelength, $\lambda_2$.

14. The method of claim 12, wherein said restoring step b is done via a uniform exposure to a third image with wavelength, $\lambda_3$.

15. The method of claim 12, wherein said restoring step b is done via thermal means.

16. The method of claim 12, wherein sharpness and feature sizes of said first and second patterns are controlled by the ratio of the intensities at the two wavelengths, $\lambda_1$ and $\lambda_2$, in addition to photophysical characteristics of the AML.

* * * * *